United States Patent
Wang et al.

(10) Patent No.: US 8,253,149 B2
(45) Date of Patent: Aug. 28, 2012

(54) LIGHT EMITTING DIODE DEVICE

(75) Inventors: Chun-Wei Wang, Miao-Li Hsien (TW);
Hung-Kuang Hsu, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 617 days.

(21) Appl. No.: 12/198,284

(22) Filed: Aug. 26, 2008

(65) Prior Publication Data
US 2009/0184333 A1 Jul. 23, 2009

(30) Foreign Application Priority Data
Jan. 17, 2008 (CN) .......................... 2008 1 0300141

(51) Int. Cl.
*H01L 29/18* (2006.01)
*H01L 33/00* (2010.01)
(52) U.S. Cl. ................... 257/88; 257/E33.061
(58) Field of Classification Search .............. 257/88, 257/E33.061
See application file for complete search history.

(56) References Cited

U.S. PATENT DOCUMENTS

| | | | |
|---|---|---|---|
| 6,596,195 B2 * | 7/2003 | Srivastava et al. | 252/301.4 R |
| 7,999,283 B2 * | 8/2011 | Chakraborty et al. | 257/100 |
| 2001/0030326 A1 * | 10/2001 | Reeh et al. | 257/98 |
| 2003/0038596 A1 * | 2/2003 | Ho | 313/512 |
| 2005/0221519 A1 | 10/2005 | Leung et al. | |
| 2006/0073625 A1 | 4/2006 | Harada | |
| 2008/0191608 A1 * | 8/2008 | Schmidt | 313/503 |
| 2008/0231181 A1 * | 9/2008 | Pang | 313/512 |
| 2009/0057698 A1 * | 3/2009 | Okamura et al. | 257/98 |

FOREIGN PATENT DOCUMENTS

| | | |
|---|---|---|
| CN | 1838440 A | 9/2006 |
| CN | 1858920 A | 11/2006 |
| CN | 1934721 A | 3/2007 |
| CN | 2879217 Y | 3/2007 |
| TW | 2007003710 A | 1/2007 |
| WO | 2007005013 A1 | 1/2007 |

\* cited by examiner

*Primary Examiner* — Stephen W Smoot
*Assistant Examiner* — Vicki B Booker
(74) *Attorney, Agent, or Firm* — Altis Law Group, Inc.

(57) ABSTRACT

An LED device includes a substrate, a plurality of LEDs, a first light pervious layer, a reflective plate, and a plurality of phosphor particles contained in the first light pervious layer. The LEDs are electrically mounted on the substrate and configured for emitting light of a first wavelength. The reflective plate is mounted on the substrate for directing the light of the first wavelength to transmit through the first light pervious layer. The phosphor particles are configured for converting the light of the first wavelength into light of a second wavelength. A distribution of the phosphor particles in the first light pervious layer gradually decreases from a center to a periphery thereof.

8 Claims, 5 Drawing Sheets

LIGHT EMITTING DIODE DEVICE

CROSS REFERENCE TO RELATED APPLICATION

This application is related to commonly-assigned copending applications Ser. No. 12/192,382, entitled "LIGHT SOURCE MODULE OF LIGHT EMITTING DIODE". Disclosures of the above-identified application are incorporated herein by reference.

BACKGROUND

1. Technical Field

The present invention relates to illuminating devices, and particularly to a full color light emitting diode (LED) illuminating device.

2. Description of related art

Generally, LEDs include a substrate, an LED chip disposed on the substrate, and a light pervious encapsulation covering the LED chip. Usually, a bowl or cup shaped space is defined in the substrate for receiving the LED chip, and for receiving silicon or epoxy resin. One or more visible light-emitting phosphors are integrated in the silicon or epoxy resin. Light emitted from the LED chip excites the phosphors to emit a desired color of light. Light in proper combination can produce a net emission of white light.

However, the phosphors are integrated into the LED package, which makes the manufacturing process of the LED more complex. In addition, because the silicon or epoxy resin is directly contacted to the LED chip, the luminous efficiency of the phosphor is easily influenced by the heat dissipated from the LED chip. Furthermore, each LED has a particular light intensity distribution, therefore when a number of LEDs are arranged in an array, the mix of colors is difficult to control.

Therefore, what is needed, is an LED device to overcome the above-described deficiencies.

SUMMARY

One present embodiment provides an LED device. The LED device includes a substrate, a plurality of LEDs, a first light pervious layer, a reflective plate, and a plurality of phosphor particles contained in the first light pervious layer. The LEDs are electrically mounted on the substrate and configured for emitting light of a first wavelength. The reflective plate is mounted on the substrate for directing the light of the first wavelength to transmit through the first light pervious layer. The phosphor particles are configured for converting the light of the first wavelength into light of a second wavelength. A distribution of the phosphor particles in the first light pervious layer gradually decreases from a center to a periphery thereof.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE EMBODIMENTS

Embodiments will now be described in detail below and with reference to the drawings.

Figure 1:
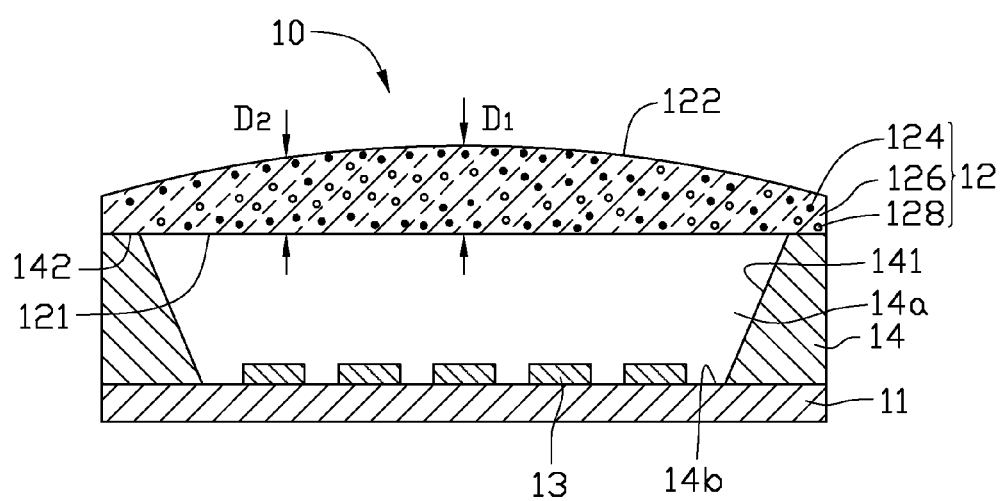
FIG. 1 is a schematic, cross-sectional view of an LED device according to a first embodiment.

Referring to FIG. 1, an exemplary full color LED device 10 according to a first embodiment is shown. The LED device 10 includes a printed circuit board 11, a light converting layer 12 and a plurality of LEDs 13.

The LEDs 13 can produce light from a particular part of the light spectrum. In the present embodiment, the LEDs 13 produce blue light (in wavelengths from 430 to 470 nanometers in the light spectrum). The LEDs 13 are electrically connected to the printed circuit board 11 and an outside power source (not shown).

The printed circuit board 11 can be an FR4 printed circuit board (PCB), a metal core printed circuit board (MCPCB), a silicon substrate having a circuit printed thereon, or a ceramic substrate having a circuit printed thereon. FR4 is a known type of epoxy resin substrate, so named by the National Electrical Manufacturers Association (NEMA). FR denotes that a material of the substrate is a flame retardant and flame resistant material.

The LED device 10 further includes an annular reflective plate 14. The annular reflective 14 has a first end (not labeled) and a second end (not labeled) opposite to the first end. The first end of the annular reflective plate 14 is mounted on the bottom surface 14b of the printed circuit board 11. The inner surface 141 of the annular reflective plate 14 and the bottom surface 14b of the printed circuit board 11 cooperatively define an accommodating room 14a. The LEDs 13 are received in the accommodating room 14a and mounted on the bottom surface 14b of the printed circuit board 11. In the present embodiment, the plurality of LEDs is arranged in an array.

The annular reflective plate 14 can be made of a reflective material. The reflective material can be a metal such as silver, aluminum, copper and so on. The reflective material also can be ceramic or silicon.

The inner surface 141 of the annular reflective plate 14 is inclined relative to the bottom surface 14b of the printed circuit board 11. Light emitted from the LEDs is reflected by the inner surface 141 of the annular reflective plate 14, and then transmitted out from the opening of the annular reflective plate 14.

The light converting layer 12 is mounted on the second end of the annular reflective plate 14 and covers the LEDs 13. The light converting layer 12 contains a number of phosphor particles 124. Because the light converting layer 12 and the LEDs 13 are partitioned by the annular reflective plate 14, the luminous efficiency of the phosphor particle 124 is not likely to be influenced by the heat dissipated from the LEDs. Thus the luminous efficiency of the LED device 10 is increased.

The light converting layer 12 includes a light pervious layer 126. The phosphor particles 124 is doped in the light pervious layer 126. The light pervious layer 126 can be made of silicon or epoxy resin. The phosphor particle 124 can be a yellow phosphor, such as a cerium-doped yttrium-aluminum garnet phase (YAG: Ce) phosphor, a yellow nitride phosphor, a yellow silicate phosphor and so on. The phosphor particle 124 also can be a green phosphor, such as green nitride phosphor, a green silicate phosphor and so on. In operation, a part of the blue light emitted from the blue LEDs 13 strike the yellow phosphors or green phosphors doped in the light pervious layer 126, and the phosphors correspondingly fluoresce yellow or green light. The combination of the blue light that passes through the light pervious layer 126 without striking the phosphors and the light emitted by the phosphors produce a net emission of white light.

In the first embodiment, the light pervious layer 126 includes a first surface 121 on one side facing the LEDs 13 and a second surface 122 on the opposite side. The first surface 121 is a planar surface. The second surface 122 is a convex surface. A thickness $D_1$ of the central portion of the light pervious layer 126 is larger than a peripheral thickness $D_2$ thereof.

The light pervious layer 126 can be further doped with diffusing particles 128. The diffusing particles 128 can be made of a light-permeable material including but not limited to polymethylmethacrolate (PMMA), fused silica, fused quartz, aluminum oxide ($Al_2O_3$), magnesium oxide (MgO), or titanium dioxide ($TiO_2$). The diffusing particles 128 can also be calcium fluoride ($CaF_2$) particles, silicon dioxide ($SiO_2$) particles, calcium carbonate ($CaCO_3$) particles, or barium sulfate ($BaSO_4$) particles.

Figure 2:
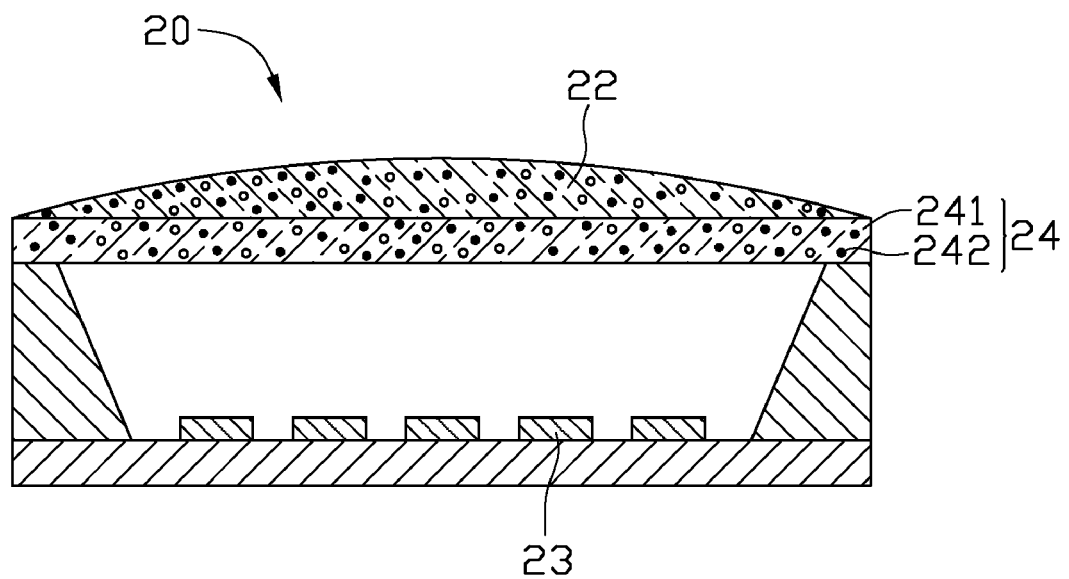
FIG. 2 is a schematic, cross-sectional view of an LED device according to a second embodiment.

Referring to FIG. 2, an exemplary LED device 20 according to a second embodiment is shown. The LED device 20 is similar to the LED device 10 in the first embodiment. However, the LED device 20 further includes an auxiliary light converting layer 24. The auxiliary light converting layer 24 includes a second light pervious layer 241. The second light pervious layer 241 is doped with red phosphors 242. In operation, a part of light emitted from LEDs 23 strikes red phosphors 242, causing the red phosphors 242 to fluoresce red light.

The auxiliary light converting layer 24 is sandwiched between the light converting layer 22 and the LEDs 23, thereby preventing the red phosphors 242 absorbing the light converted by the light converting layer 22. Because the auxiliary light converting layer 24 is applied in the LED device 20, the color rendering index (CRI) thereof can exceed 90, and the color saturation can exceed 85%.

Figure 3:
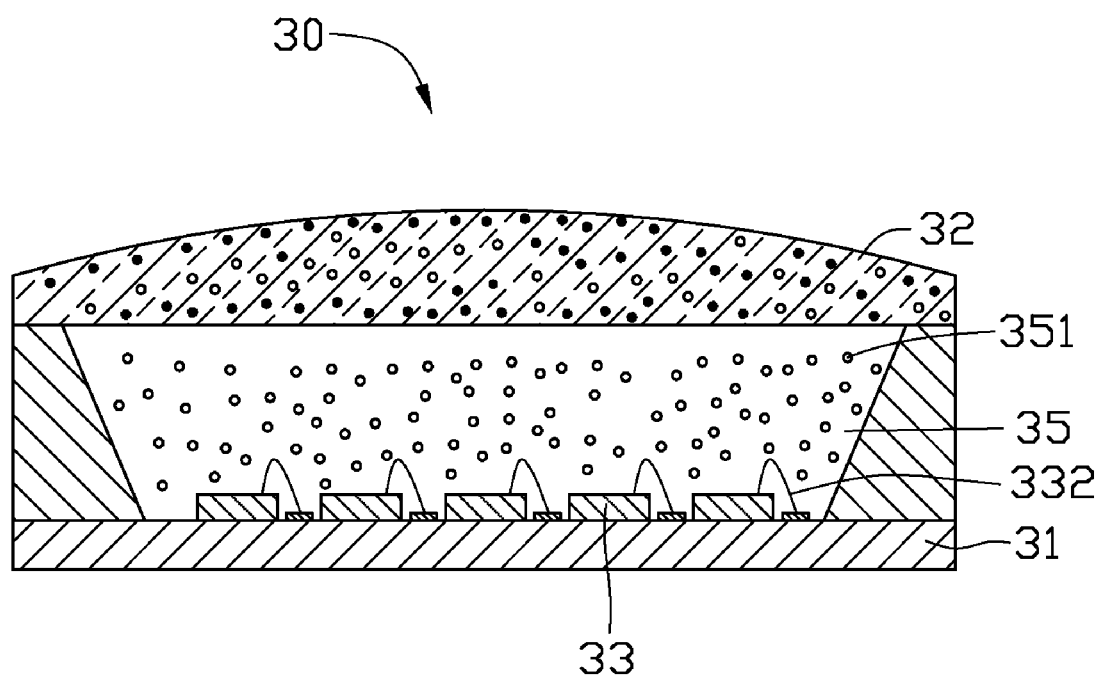
FIG. 3 is a schematic, cross-sectional view of an LED device according to a third embodiment.

Referring to the FIG. 3, an exemplary LED device 30 according to a third embodiment is shown. The LED device 30 is similar to the LED device 10 in the first embodiment. However, the LEDs 33 in the third embodiment are unpackaged LED chips electrically mounted on a printer circuit board 31 via gold wires 332. The LED device 30 further includes a light pervious encapsulation 35. The light pervious encapsulation 35 is received in an accommodating room (not shown) defined cooperatively by the printed circuit board 31, an annular reflective plate 34 and a light converting layer 32. The light pervious encapsulation 35 can be made of silicon or epoxy resin. In this embodiment, the refractive index of the light pervious encapsulation 35 is larger than that of the light converting layer 32.

The light pervious encapsulation 35 can be further doped with diffusing particles 351. The diffusing particles 351 can be made of a light-permeable material including but not limited to PMMA, fused silica, fused quartz, $Al_2O_3$, MgO, or titanium dioxide $TiO_2$. The diffusing particles 351 can also be $CaF_2$ particles, $SiO_2$ particles, $CaCO_3$ particles, or $BaSO_4$ particles.

Figure 4:
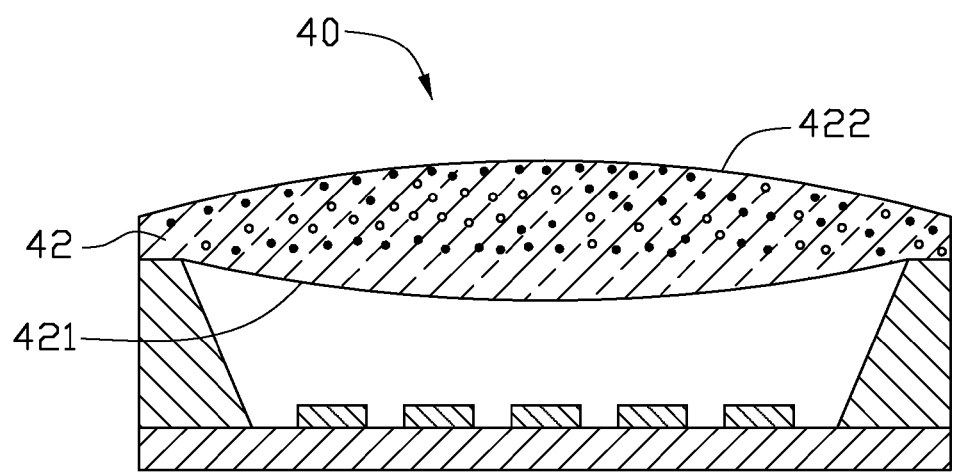
FIG. 4 is a schematic, cross-sectional view of an LED device according to a fourth embodiment.

Referring to the FIG. 4, an exemplary LED device 40 according to a fourth embodiment is shown. The LED device 40 is similar to the LED device 10 in the first embodiment. However, a first surface 421 and a second surface 422 of a light converting layer 42 in the fourth embodiment are convex surfaces. The thickness of the light converting layer 42 is gradually decreased from a central portion to a peripheral portion thereof.

Figure 5:
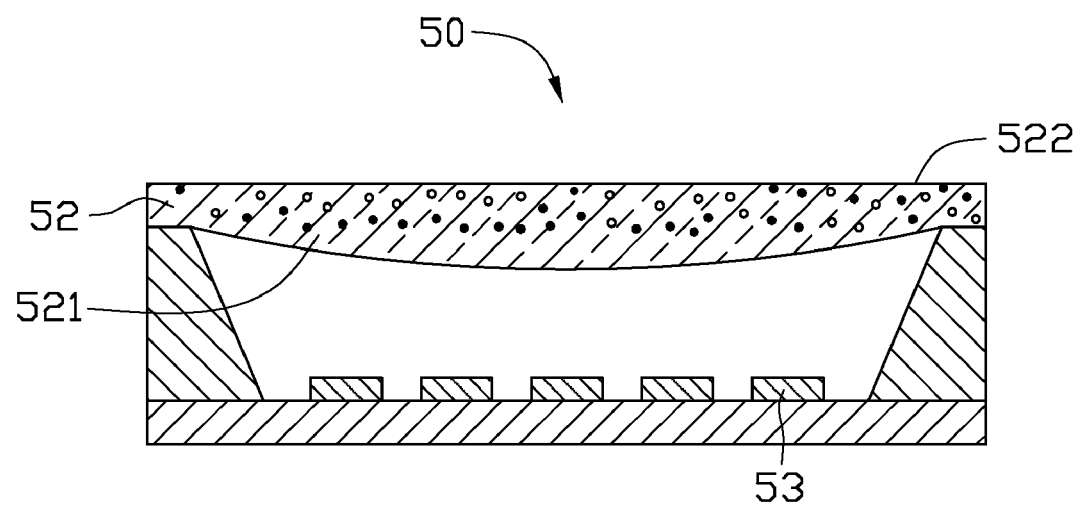
FIG. 5 is a schematic, cross-sectional view of an LED device according to a fifth embodiment.

Referring to the FIG. 5, an exemplary LED device 50 according to a fifth embodiment is shown. The LED device 50 is similar to the LED device 10 in the first embodiment. However, a light converting layer 52 includes a first surface 521 on one side facing the LEDs 53 and a second surface 522 on the opposite side. The first surface 521 is a convex surface. The second surface 522 is a planar surface. The first surface 521 curves or bulges towards the LEDs 53.

While certain embodiment has been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. An LED device, comprising:
   a substrate;
   a plurality of LEDs electrically mounted on the substrate and configured for emitting light of a first wavelength;
   a first light pervious layer;
   a reflective plate mounted on the substrate for directing the light of the first wavelength to transmit through the first light pervious layer;
   a plurality of phosphor particles contained in the first light pervious layer for converting the light of the first wavelength into light of a second wavelength, a thickness of the first light pervious layer gradually decreasing from a center to a periphery thereof; and
   a plurality of diffusing particles doped in the first light pervious layer for diffusing the light transmitting therethrough;
   wherein the reflective plate comprises a first end and a second end opposite to the first end, the first end of the reflective plate is mounted on the substrate, the first light pervious layer is mounted on the second end of the reflective plate and covers the LEDs.

2. The LED device of claim 1, wherein the first light pervious layer comprises a first surface and an opposing second surface, and the first surface faces to the LEDs.

3. The LED device of claim 2, wherein the first surface is a planar surface, and the second surface is a convex surface.

4. The LED device of claim 2, wherein the first surface and the second surface are convex surfaces.

5. The LED device of claim 2, wherein the first surface is a convex surface, and the second surface is a planar surface.

6. The LED device of claim 1, wherein the light of the first wavelength is blue light, and the phosphor particles are yellow phosphor particles or green phosphor particles.

7. The LED device of claim 6, further comprising a second light pervious layer disposed between the first light pervious layer and the LEDs, and red phosphor particles doped in the second light pervious layer.

8. The LED device of claim 1, wherein the diffusing particles are selected from the group consisting of polymethylmethacrolate particles, fused silica particles, fused quartz particles, aluminum oxide particles, magnesium oxide particles, titanium dioxide particles, calcium fluoride particles, silicon dioxide particles, calcium carbonate particles, and barium sulfate particles.

* * * * *